(12) United States Patent
Zhou

(10) Patent No.: US 12,302,597 B2
(45) Date of Patent: May 13, 2025

(54) PLANAR HIGH-ELECTRON-MOBILITY TRANSISTOR

(71) Applicant: Nantong Sanrise Integrated Circuit Co., LTD, Jiangsu (CN)

(72) Inventor: Xiang Zhou, Jiangsu (CN)

(73) Assignee: Nantong Sanrise Integrated Circuit Co., LTD, Jiangsu (CN)

( * ) Notice: Subject to any disclaimer, the term of this patent is extended or adjusted under 35 U.S.C. 154(b) by 526 days.

(21) Appl. No.: 17/517,425

(22) Filed: Nov. 2, 2021

(65) Prior Publication Data

US 2022/0199814 A1    Jun. 23, 2022

(30) Foreign Application Priority Data

Dec. 23, 2020    (CN) .......................... 202011536169.0

(51) Int. Cl.
*H10D 30/47*    (2025.01)
*H10D 62/824*    (2025.01)
(Continued)

(52) U.S. Cl.
CPC ....... *H10D 30/4732* (2025.01); *H10D 62/824* (2025.01); *H10D 62/8503* (2025.01); *H10D 64/254* (2025.01); *H10D 64/513* (2025.01)

(58) Field of Classification Search
CPC ............. H01L 29/7783; H01L 29/2003; H01L 29/205; H01L 29/4175; H01L 29/4236;
(Continued)

(56) References Cited

U.S. PATENT DOCUMENTS

| 2013/0313560 A1* | 11/2013 | Khalil | H01L 29/66469 |
| | | | 257/E21.403 |
| 2015/0021552 A1* | 1/2015 | Mishra | H01L 29/205 |
| | | | 257/20 |

(Continued)

OTHER PUBLICATIONS

Gladysiewicz et al. (J. Phys. D: Appl. Phys. 49 (2016) 345106 (9pp)) (Year: 2016).*

(Continued)

*Primary Examiner* — Kretelia Graham
*Assistant Examiner* — Jaesun Lee
(74) *Attorney, Agent, or Firm* — Banner & Witcoff, Ltd.

(57) ABSTRACT

The present application discloses a planar High-Electron-Mobility Transistor (HEMT), which includes a hetero-junction consisting of a first semiconductor epitaxial layer and a second semiconductor epitaxial layer, and two-dimensional electron gas located at an interface of the hetero-junction; a bottom surface of a gate trench of a trench gate is located at a bottom of the two-dimensional electron gas to cut off the two-dimensional electron gas; when gate-source voltage is higher than or equal to threshold voltage, an inversion layer is formed on a surface of the first semiconductor epitaxial layer covered by side surfaces and a bottom surface of a gate conductive material layer, and the source-end and drain-end two-dimensional electron gas is conducted to enable the device to be on; when the gate-source voltage is lower than the threshold voltage, the source-end and drain-end two-dimensional electron gas is cut off to enable the device to be off.

16 Claims, 6 Drawing Sheets

(51) Int. Cl.
*H10D 62/85* (2025.01)
*H10D 64/23* (2025.01)
*H10D 64/27* (2025.01)

(58) Field of Classification Search
CPC ............. H01L 29/0657; H01L 29/7786; H01L 29/0615; H01L 29/66462; H01L 29/7787
See application file for complete search history.

(56) References Cited

U.S. PATENT DOCUMENTS

| | | | | |
|---|---|---|---|---|
| 2016/0380090 | A1* | 12/2016 | Roberts | H01L 23/528 |
| | | | | 257/76 |
| 2018/0182879 | A1* | 6/2018 | Ren | H01L 29/66863 |
| 2018/0374952 | A1* | 12/2018 | Khalil | H01L 29/66462 |
| 2019/0081164 | A1* | 3/2019 | Shrivastava | H01L 29/778 |
| 2020/0328108 | A1* | 10/2020 | Walke | H01L 29/7786 |

OTHER PUBLICATIONS

Rashmi et al. (Solid-State Electronics 46 (2002) 621-630) (Year: 2002).*
Levitopher et al.—Field between the plates of a parallel plate capacitor using Gauss's Law (Year: 2017).*

* cited by examiner

PLANAR HIGH-ELECTRON-MOBILITY TRANSISTOR

CROSS-REFERENCES TO RELATED APPLICATIONS

This application claims priority to Chinese Patent Application No. 202011536169.0, filed on Dec. 23, 2020, the disclosure of which is incorporated herein by reference in its entirety.

TECHNICAL FIELD

The present application relates to the field of semiconductor integrated circuit manufacturing, in particular to a planar High-Electron-Mobility Transistor (HEMT).

BACKGROUND

As a typical wide-bandgap semiconductor material, gallium nitride is often used in the manufacture of power semiconductor devices in various studies. Especially in the application of high temperature and high voltage, the gallium nitride material has more obvious advantages because of its large bandgap of 3.4 eV, high breakdown electric field strength of 3 MV/cm, high electron mobility and high thermal conductivity. So far, the mainstream gallium nitride devices still focus on the research of planar HEMTs. The manufacturing process of this kind of devices has gradually matured and has entered the stage of marketization. However, there is no consensus in the industry on the way to realize normally-off gallium nitride HEMTs.

The specific on resistance (Ron, sp) of the existing power devices is related to the Breakdown Voltage (BV). The higher the breakdown voltage, the higher the specific on resistance. For the traditional power semiconductor devices, there is a physical limit of Ron, sp vs. BV, also known as one-dimensional physical limit (1-D limit).

BRIEF SUMMARY

The technical problem to be solved by the present application is to provide a planar high-electron-mobility transistor, which can cut off the two-dimensional electron gas, thus facilitating the independent adjustment of the threshold voltage, facilitating the realization of a normally-off planar high-electron-mobility transistor, also facilitating the adjustment of an electric field in a drift region so that the electric field in the drift region is evenly distributed, improving the breakdown voltage of the device, reducing the specific on resistance and size of the device while maintaining the adjustment of the breakdown voltage, and greatly reducing the energy loss when the device is on. It can be applied to gallium nitride materials, give full play to the advantages of gallium nitride materials, reduce the manufacturing cost of gallium nitride devices and simplify the process flow.

In order to solve the technical problem, a device unit of the planar high-electron-mobility transistor provided by the present application includes:

a first semiconductor epitaxial layer and a second semiconductor epitaxial layer formed on a surface of the first semiconductor epitaxial layer, the first semiconductor epitaxial layer and the second semiconductor epitaxial layer forming a first hetero-junction and forming two-dimensional electron gas at an interface of the first hetero-junction;

a trench gate including a gate trench, a gate dielectric layer formed on an inner side surface of the gate trench and a gate conductive material layer filled in the gate trench, wherein the gate trench passes through the second semiconductor epitaxial layer so that a bottom surface of the gate trench is located in the first semiconductor epitaxial layer at the bottom of the two-dimensional electron gas, and the trench gate cuts off the two-dimensional electron gas into source-end two-dimensional electron gas and drain-end two-dimensional electron gas;

a source metal layer has spacing from a first side surface of the gate trench and forms an ohmic contact with the source-end two-dimensional electron gas;

a drain metal layer has spacing from a second side surface of the gate trench and forms an ohmic contact with the drain-end two-dimensional electron gas;

the gate conductive material layer is connected to a gate metal layer;

when gate-source voltage between the gate metal layer and the source metal layer is higher than or equal to threshold voltage, an inversion layer is formed on a surface of the first semiconductor epitaxial layer covered by side surfaces and a bottom surface of the gate conductive material layer, the inversion layer enables the source-end two-dimensional electron gas and the drain-end two-dimensional electron gas to be conducted to jointly form a conductive channel that enables the source metal layer and the drain metal layer to be conducted and to enable the device to be on;

when the gate source voltage between the gate metal layer and the source metal layer is lower than the threshold voltage, the source-end two-dimensional electron gas and the drain-end two-dimensional electron gas are cut off to enable the device to be off.

As a further improvement, the planar high-electron-mobility transistor is an enhanced device and the threshold voltage is more than 0V.

As a further improvement, the first semiconductor epitaxial layer adopts a wide-bandgap semiconductor material and the second semiconductor epitaxial layer adopts a wide-bandgap semiconductor material.

As a further improvement, the material of the first semiconductor epitaxial layer includes gallium nitride and the material of the second semiconductor epitaxial layer includes aluminum gallium nitride.

As a further improvement, the first semiconductor epitaxial layer is formed on a buffer layer and the buffer layer is formed on a substrate.

As a further improvement, the material of the substrate includes silicon or sapphire.

As a further improvement, the drift region is located between the drain metal layer and the second side surface of the gate trench, a charge balance structure is arranged in the drift region, and during reverse bias, the charge balance structure enables the electric field distribution in the drift region to be uniform.

As a further improvement, the charge balance structure includes:

a third semiconductor epitaxial layer arranged on a surface of the second semiconductor epitaxial layer in the drift region, wherein the material of the third semiconductor epitaxial layer includes gallium nitride;

bound charges are formed at an interface of a second hetero-junction formed by the third semiconductor epitaxial layer and the second semiconductor epitaxial layer, and the electric field distribution in the drift region is adjusted and enabled to be uniform through the bound charges at the interface of the second hetero-junction.

As a further improvement, the third semiconductor epitaxial layer continuously covers the surface of the second semiconductor epitaxial layer in the drift region.

As a further improvement, on the surface of the second semiconductor epitaxial layer in the drift region, the third semiconductor epitaxial layer is divided into more than one third semiconductor epitaxial layer sub-segments and more than one third semiconductor epitaxial layer spacer regions, the third semiconductor epitaxial layer sub-segments and the third semiconductor epitaxial layer spacer regions are alternately arranged on the surface of the second semiconductor epitaxial layer in the drift region.

As a further improvement, the number of the third semiconductor epitaxial layer sub-segments is one and the number of the third semiconductor epitaxial layer spacer regions is one;

in a direction from the second side surface of the gate trench to the drain metal layer, the third semiconductor epitaxial layer sub-segment and the third semiconductor epitaxial layer spacer region are sequentially arranged; or in the direction from the second side surface of the gate trench to the drain metal layer, the third semiconductor epitaxial layer spacer region and the third semiconductor epitaxial layer sub-segment are sequentially arranged.

As a further improvement, the number of the third semiconductor epitaxial layer sub-segments is more than one and the number of the third semiconductor epitaxial layer spacer regions is one less than the number of the third semiconductor epitaxial layer sub-segments;

in a direction from the second side surface of the gate trench to the drain metal layer, the third semiconductor epitaxial layer sub-segments and the third semiconductor epitaxial layer spacer regions are sequentially arranged.

As a further improvement, after the third semiconductor epitaxial layer is formed through epitaxial growth of the third semiconductor epitaxial layer sub-segment, selective etching is performed to the third semiconductor epitaxial layer.

As a further improvement, the thickness of the third semiconductor epitaxial layer is less than 5 nm.

As a further improvement, the charge balance structure includes:

a structure in which the thickness of the second semiconductor epitaxial layer varies in a direction from the second side surface of the gate trench to the drain metal layer, wherein the bound charge density at the interface of the first hetero-junction is adjusted by adjusting the thickness of the second semiconductor epitaxial layer so that the electric field distribution in the drift region is uniform.

As a further improvement, in the direction from the second side surface of the gate trench to the drain metal layer, the second semiconductor epitaxial layer is divided into more than two second semiconductor epitaxial layer sub-segments according to thickness.

As a further improvement, in the direction from the second side surface of the gate trench to the drain metal layer, the thickness of each of the second semiconductor epitaxial layer sub-segments sequentially increases or decreases, or sequentially increases first and then sequentially decreases after increasing to a maximum value, or sequentially decreases first and then sequentially increases after decreasing to a minimum value.

As a further improvement, each of the second semiconductor epitaxial layer sub-segments obtains the thickness of the corresponding second semiconductor epitaxial layer sub-segment through an etching process after the second semiconductor epitaxial layer is formed at one time;

or each of the second semiconductor epitaxial layer sub-segments is formed through a plurality of times of epitaxy and etching process.

As a further improvement, the length of each of the second semiconductor epitaxial layer sub-segments is the same or different.

As a further improvement, in a direction from the second side surface of the gate trench to the drain metal layer, the thickness of the second semiconductor epitaxial layer gradually increases or decreases according to a linear function, or increases first according to a linear function and then decreases according to a linear function after increasing to a maximum value, or decreases first according to a linear function and then increases according to a linear function after decreasing to a minimum value.

As a further improvement, the material of the gate dielectric layer includes silicon oxide or aluminum oxide;

the gate conductive material layer includes a polysilicon gate or a metal gate.

As a further improvement, the first semiconductor epitaxial layer is of first conductive type doping or second conductive type doping, or is undoped.

The present application can cut off the two-dimensional electron gas by forming a trench gate and passing the bottom of the gate trench of the trench gate to a position under the two-dimensional electron gas, so that the formation of the conductive channel between the source and the drain is not controlled by the two-dimensional electron gas, but by the trench gate. The inversion layer formed by the inversion of the first semiconductor epitaxial layer through the trench gate can realize the on and off control of the conductive channel. That is, the present application can realize the control of the conductive channel of the HEMT by adopting the trench gate of the MOSFET. In this way, the planar high-electron-mobility transistor, like the MOSFET, can control the on and off of the conductive channel through the trench gate, thus facilitating the independent adjustment of the threshold voltage of the planar high-electron-mobility transistor, for example, adjusting the threshold voltage of the device by adjusting the work function of the gate conductive material layer of the trench gate, the thickness of the gate dielectric layer and the doping type and doping concentration of the first semiconductor epitaxial layer, and facilitating the realization of a normally-off planar high-electron-mobility transistor. However, the two-dimensional electron gas of the existing planar high-electron-mobility transistor is conducted and it is a normally-on device. The present application facilitates the realization of a normally-off planar high-electron-mobility transistor.

In addition, the present application can form a charge balance structure in the drift region between the trench gate and the drain metal layer, and adjust the electric field distribution in the drift region through the charge balance structure, thus conveniently obtaining the uniformly distributed electric field in the drift region, improving the breakdown voltage of the device, reducing the specific on resistance of the device while maintaining the adjustment of the breakdown voltage, reducing the size of the device, and greatly reducing the energy loss when the device is on. The present application can be applied to gallium nitride materials, give full play to the advantages of gallium nitride materials, reduce the manufacturing cost of gallium nitride devices and simplify the process flow.

The gallium nitride power device structure according to the present application can conveniently adjust the threshold voltage, so as to manufacture an enhanced transistor and make its application scope wider. Compared with the traditional high-electron-mobility transistors, under the same breakdown voltage, the specific on resistance is greatly reduced relative to the existing power device, thus greatly reducing the power loss of power semiconductor devices, saving energy, reducing emission, giving full play to the advantages of gallium nitride devices, simplifying the process flow and reducing the manufacturing cost.

BRIEF DESCRIPTION OF THE DRAWINGS

The present application will be further described below in detail in combination with the specific embodiments and with reference to the drawings.

DETAILED DESCRIPTION OF THE DISCLOSURE

Embodiment 1 of the present application provides a planar high-electron-mobility transistor.

Figure 1:
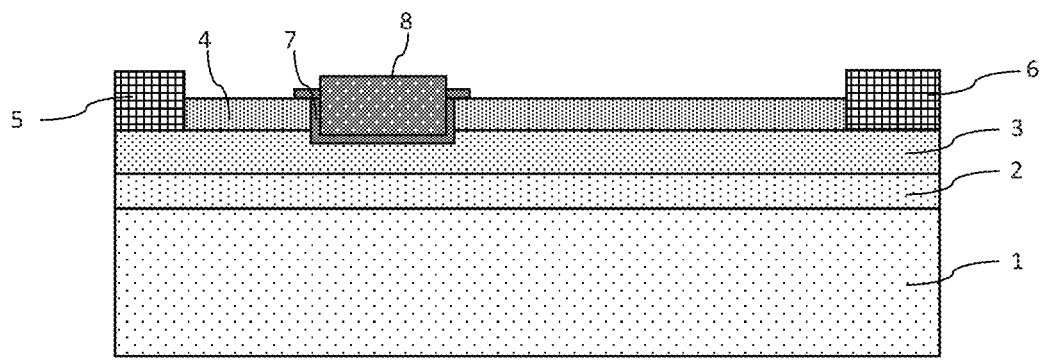
FIG. 1 illustrates a schematic diagram of a structure of a planar high-electron-mobility transistor according to embodiment 1 of the present application.
Figure 2:
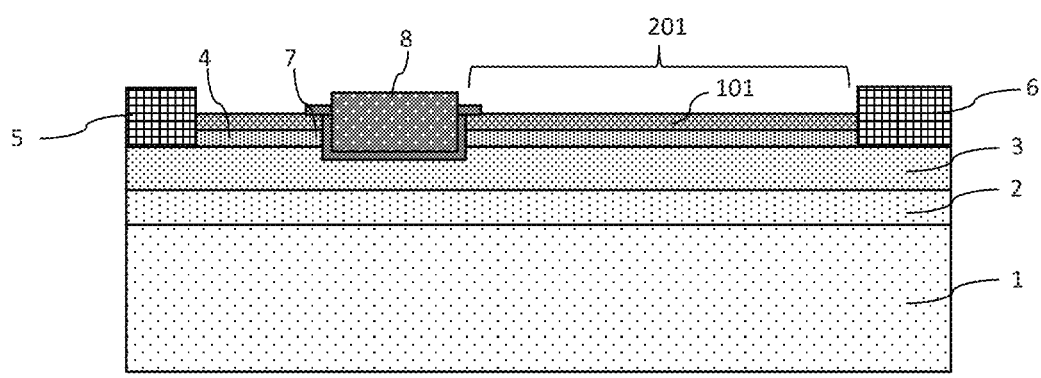
FIG. 2 illustrates a schematic diagram of a structure of a planar high-electron-mobility transistor according to embodiment 2 of the present application.

Referring to FIG. 2, it illustrates a schematic diagram of a structure of the planar high-electron-mobility transistor according to embodiment 1 of the present application. A device unit of the planar high-electron-mobility transistor according to embodiment 1 of the present application includes:

a first semiconductor epitaxial layer 3 and a second semiconductor epitaxial layer 4 formed on a surface of the first semiconductor epitaxial layer 3, the first semiconductor epitaxial layer 3 and the second semiconductor epitaxial layer 4 forming a first hetero-junction and forming two-dimensional electron gas at an interface of the first hetero-junction;

a trench gate including a gate trench, a gate dielectric layer 7 formed on an inner side surface of the gate trench and a gate conductive material layer 8 filled in the gate trench.

The gate trench passes through the second semiconductor epitaxial layer 4 so that a bottom surface of the gate trench is located in the first semiconductor epitaxial layer at the bottom of the two-dimensional electron gas, and the trench gate cuts off the two-dimensional electron gas into source-end two-dimensional electron gas and drain-end two-dimensional electron gas.

A source metal layer 5 has spacing from a first side surface of the gate trench and forms an ohmic contact with the source-end two-dimensional electron gas.

A drain metal layer 6 has spacing from a second side surface of the gate trench and forms an ohmic contact with the drain-end two-dimensional electron gas.

The gate conductive material layer 8 is connected to a gate metal layer.

When gate-source voltage between the gate metal layer and the source metal layer 5 is higher than or equal to threshold voltage, an inversion layer is formed on a surface of the first semiconductor epitaxial layer 3 covered by side surfaces and a bottom surface of the gate conductive material layer 8, the inversion layer enables the source-end two-dimensional electron gas and the drain-end two-dimensional electron gas to be conducted to jointly form a conductive channel that enables the source metal layer 5 and the drain metal layer 6 to be conducted and to enable the device to be on.

When the gate source voltage between the gate metal layer and the source metal layer 5 is lower than the threshold voltage, the source-end two-dimensional electron gas and the drain-end two-dimensional electron gas are cut off to enable the device to be off.

In embodiment 1 of the present application, the planar high-electron-mobility transistor is an enhanced device and the threshold voltage is more than 0V.

The first semiconductor epitaxial layer 3 adopts a wide-bandgap semiconductor material and the second semiconductor epitaxial layer 4 adopts a wide-bandgap semiconductor material.

The material of the first semiconductor epitaxial layer 3 includes gallium nitride and the material of the second semiconductor epitaxial layer 4 includes aluminum gallium nitride.

The first semiconductor epitaxial layer 3 is formed on a buffer layer 2 and the buffer layer 2 is formed on a substrate 1. The material of the substrate 1 includes silicon or sapphire.

The material of the gate dielectric layer 7 includes silicon oxide or aluminum oxide.

The gate conductive material layer 8 includes a polysilicon gate or a metal gate.

The first semiconductor epitaxial layer 3 is of first conductive type doping or second conductive type doping, or is undoped.

In embodiment 1 of the present application, the threshold voltage may be set through the doping structure of the first semiconductor epitaxial layer 3, the thickness of the gate dielectric layer 7 and the work function of the gate conductive material layer 8.

The buffer layer 2 is mainly used to release stress and reduce defects in the gallium nitride epitaxial layer. Since the lattice constants of the gallium nitride epitaxial layer, i.e., the first semiconductor epitaxial layer 3, and the substrate 1 are often different, the buffer layer 2 is required to eliminate the defects caused by lattice mismatch. The more common type includes super-lattice or gradual doping.

The thickness of the aluminum gallium nitrogen ($Al_xGa_{1-x}N$) epitaxial layer, i.e., the second semiconductor epitaxial layer 4 and the molar composition of aluminum atoms determine the concentration of the two-dimensional electron gas at the interface, and the thickness of the second semiconductor epitaxial layer 4 is designed as required.

The gate dielectric layer 7 is deeper than the position of the two-dimensional electron gas to ensure that the two-dimensional electron gas is cut off. It needs to be realized through an etching process in the manufacturing process, and the bottom of the gate trench is deeper than the bottom of the second semiconductor epitaxial layer 4. The gate dielectric layer 7 is an insulator film formed through a deposition process, and its thickness determines the threshold voltage of the device, which needs to be well controlled. At the same time, it is required to ensure that the bottom of the trench is well filled and the thickness is uniform during deposition.

In addition, the top of the gate conductive material layer 8 is also connected with a gate metal layer consisting of a metal layer. Generally, it is also necessary to form an interlayer film or passivation layer to realize the isolation between the source metal layer 5, the drain metal layer 6 and the gate metal layer.

Embodiment 1 of the present application can cut off the two-dimensional electron gas by forming a trench gate and passing the bottom of the gate trench of the trench gate to a position under the two-dimensional electron gas, so that the formation of the conductive channel between the source and the drain is not controlled by the two-dimensional electron gas, but by the trench gate. The inversion layer formed by the inversion of the first semiconductor epitaxial layer through the trench gate can realize the on and off control of the conductive channel. In this way, the planar high-electron-mobility transistor, like the MOSFET, can control the on and off of the conductive channel through the trench gate, thus facilitating the independent adjustment of the threshold voltage of the planar high-electron-mobility transistor, for example, adjusting the threshold voltage of the device by adjusting the work function of the gate conductive material layer 8 of the trench gate, the thickness of the gate dielectric layer 7 and the doping type and doping concentration of the first semiconductor epitaxial layer 3, and facilitating the realization of a normally-off planar high-electron-mobility transistor. However, the two-dimensional electron gas of the existing planar high-electron-mobility transistor is conducted and it is a normally-on device. Embodiment 1 of the present application facilitates the realization of a normally-off planar high-electron-mobility transistor.

Embodiment 2 of the present application provides a planar high-electron-mobility transistor.

The planar high-electron-mobility transistor according to embodiment 2 of the present application has the following difference from the planar high-electron-mobility transistor according to embodiment 1 of the present application: the planar high-electron-mobility transistor according to embodiment 2 of the present application further includes the following features:

Referring to FIG. 2, it illustrates a schematic diagram of a structure of the planar high-electron-mobility transistor according to embodiment 2 of the present application. The drift region is located between the drain metal layer 6 and the second side surface of the gate trench, a charge balance structure is arranged in the drift region, and during reverse bias, the charge balance structure enables the electric field distribution in the drift region to be uniform. In FIG. 2, the transverse region corresponding to the drift region is as illustrated by braces marked by reference sign 201.

In embodiment 2 of the present application, the charge balance structure includes:

a third semiconductor epitaxial layer 101 arranged on a surface of the second semiconductor epitaxial layer 4 in the drift region. The material of the third semiconductor epitaxial layer 101 includes gallium nitride.

Bound charges are formed at an interface of a second hetero-junction formed by the third semiconductor epitaxial layer 101 and the second semiconductor epitaxial layer 4, and the electric field distribution in the drift region is adjusted and enabled to be uniform through the bound charges at the interface of the second hetero-junction.

The third semiconductor epitaxial layer 101 continuously covers the surface of the second semiconductor epitaxial layer 4 in the drift region.

The thickness of the third semiconductor epitaxial layer 101 is less than 5 nm.

In addition, embodiment 2 of the present application can form a charge balance structure in the drift region between the trench gate and the drain metal layer 6, and adjust the electric field distribution in the drift region through the charge balance structure, thus conveniently obtaining the uniformly distributed electric field in the drift region, improving the breakdown voltage of the device, reducing the specific on resistance of the device while maintaining the adjustment of the breakdown voltage, reducing the size of the device, and greatly reducing the energy loss when the device is on. Embodiment 2 of the present application can be applied to gallium nitride materials, give full play to the advantages of gallium nitride materials, reduce the manufacturing cost of gallium nitride devices and simplify the process flow.

The gallium nitride power device structure according to embodiment 2 of the present application can conveniently adjust the threshold voltage, so as to manufacture an enhanced transistor and make its application scope wider. Compared with the traditional high-electron-mobility transistors, under the same breakdown voltage, the specific on resistance is greatly reduced relative to the existing power device, thus greatly reducing the power loss of power semiconductor devices, saving energy, reducing emission, giving full play to the advantages of gallium nitride devices, simplifying the process flow and reducing the manufacturing cost.

Embodiment 3 of the present application provides a planar high-electron-mobility transistor.

Figure 3:
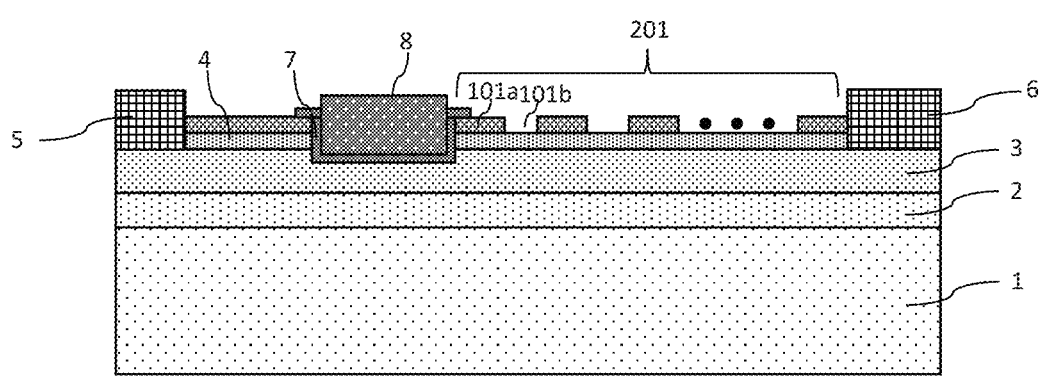
FIG. 3 illustrates a schematic diagram of a structure of a planar high-electron-mobility transistor according to embodiment 3 of the present application.

The planar high-electron-mobility transistor according to embodiment 3 of the present application has the following difference from the planar high-electron-mobility transistor according to embodiment 2 of the present application: the planar high-electron-mobility transistor according to embodiment 3 of the present application further includes the following features:

Referring to FIG. 3, it illustrates a schematic diagram of a structure of the planar high-electron-mobility transistor according to embodiment 3 of the present application. On the surface of the second semiconductor epitaxial layer 4 in the drift region, the third semiconductor epitaxial layer 101 is divided into more than one third semiconductor epitaxial layer sub-segments 101a and more than one third semiconductor epitaxial layer spacer regions 101b, the third semiconductor epitaxial layer sub-segments 101a and the third semiconductor epitaxial layer spacer regions 101b are alternately arranged on the surface of the second semiconductor epitaxial layer 4 in the drift region.

In embodiment 3 of the present application, the number of the third semiconductor epitaxial layer 101 may be finite or extended to infinite, that is, it has infinite elements.

Figure 3A:
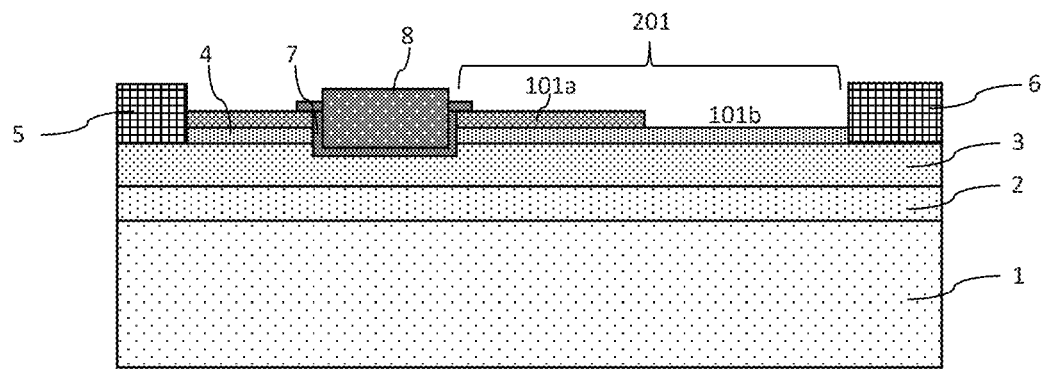
FIG. 3A illustrates a schematic diagram of a first structure corresponding to FIG. 3 when the number of third semiconductor epitaxial layer sub-segments is one and the number of third semiconductor epitaxial layer spacer regions is one.

Referring to FIG. 3A, it illustrates a schematic diagram of a first structure corresponding to FIG. 3 when the number of third semiconductor epitaxial layer sub-segments is one and the number of third semiconductor epitaxial layer spacer regions is one. The number of the third semiconductor epitaxial layer sub-segments 101a is one and the number of the third semiconductor epitaxial layer spacer regions 101b is one. In a direction from the second side surface of the gate trench to the drain metal layer 6, the third semiconductor epitaxial layer sub-segment 101a and the third semiconductor epitaxial layer spacer region 101b are sequentially arranged.

Figure 3B:
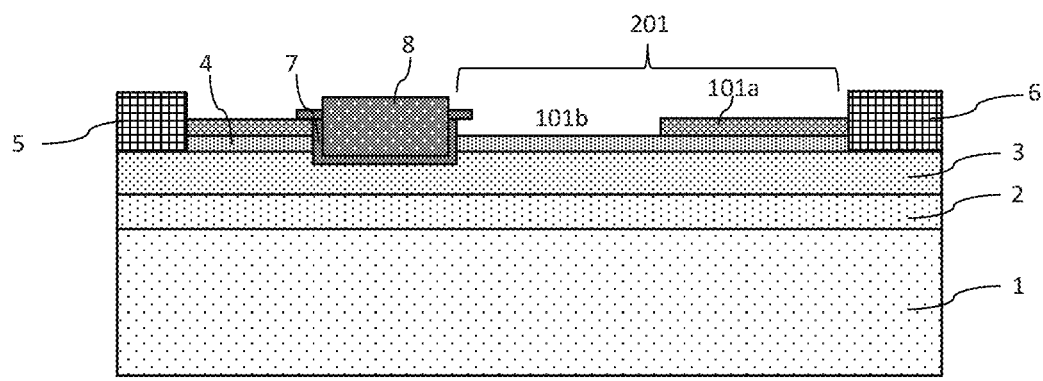
FIG. 3B illustrates a schematic diagram of a second structure corresponding to FIG. 3 when the number of third semiconductor epitaxial layer sub-segments is one and the number of third semiconductor epitaxial layer spacer regions is one.

Referring to FIG. 3B, it illustrates a schematic diagram of a first structure corresponding to FIG. 3 when the number of third semiconductor epitaxial layer sub-segments is one and the number of third semiconductor epitaxial layer spacer regions is one. The number of the third semiconductor epitaxial layer sub-segments 101a is one and the number of the third semiconductor epitaxial layer spacer regions 101b is one. In the direction from the second side surface of the gate trench to the drain metal layer 6, the third semiconductor epitaxial layer spacer region 101b and the third semiconductor epitaxial layer sub-segment 101a are sequentially arranged.

Alternatively, the number of the third semiconductor epitaxial layer sub-segments 101a is more than one and the number of the third semiconductor epitaxial layer spacer regions 101b is one less than the number of the third semiconductor epitaxial layer sub-segments 101a. In a direction from the second side surface of the gate trench to the drain metal layer 6, the third semiconductor epitaxial layer sub-segments 101a and the third semiconductor epitaxial layer spacer regions 101b are sequentially arranged.

Figure 3C:
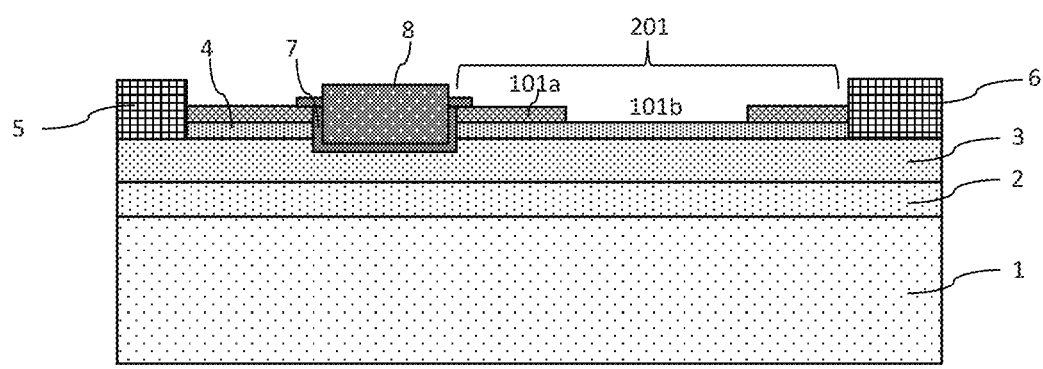
FIG. 3C illustrates a schematic diagram of a structure corresponding to FIG. 3 when the number of third semiconductor epitaxial layer sub-segments is two and the number of third semiconductor epitaxial layer spacer regions is one.

Referring to FIG. 3C, it illustrates a schematic diagram of a structure corresponding to FIG. 3 when the number of third semiconductor epitaxial layer sub-segments is two and the number of third semiconductor epitaxial layer spacer regions is one. It can be seen that, in the direction from the second side surface of the gate trench to the drain metal layer 6, the third semiconductor epitaxial layer sub-segments 101a and the third semiconductor epitaxial layer spacer region 101b are sequentially arranged.

Embodiment 4 of the present application provides a planar high-electron-mobility transistor.

Figure 4:
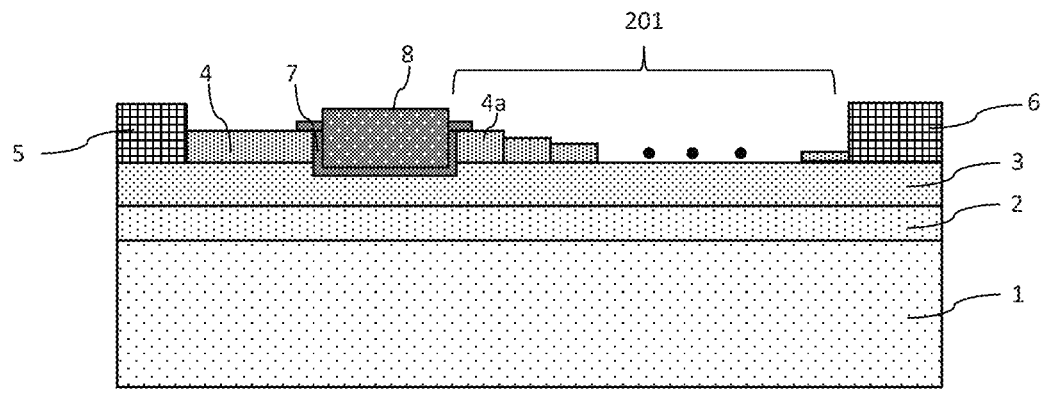
FIG. 4 illustrates a schematic diagram of a structure of a planar high-electron-mobility transistor according to embodiment 4 of the present application.

The planar high-electron-mobility transistor according to embodiment 4 of the present application has the following difference from the planar high-electron-mobility transistor according to embodiment 1 of the present application: the planar high-electron-mobility transistor according to embodiment 4 of the present application further includes the following features:

Referring to FIG. 4, it illustrates a schematic diagram of a structure of the planar high-electron-mobility transistor according to embodiment 4 of the present application. The drift region is located between the drain metal layer 6 and the second side surface of the gate trench, a charge balance structure is arranged in the drift region, and during reverse bias, the charge balance structure enables the electric field distribution in the drift region to be uniform. In FIG. 4, the transverse region corresponding to the drift region is as illustrated by braces marked by reference sign 201.

The charge balance structure includes:

a structure in which the thickness of the second semiconductor epitaxial layer 4 varies in a direction from the second side surface of the gate trench to the drain metal layer 6. The bound charge density at the interface of the first heterojunction is adjusted by adjusting the thickness of the second semiconductor epitaxial layer 4 so that the electric field distribution in the drift region is uniform.

In the direction from the second side surface of the gate trench to the drain metal layer 6, the second semiconductor epitaxial layer 4 is divided into more than two second semiconductor epitaxial layer sub-segments 4a according to thickness.

In embodiment 4 of the present application, in the direction from the second side surface of the gate trench to the drain metal layer 6, the thickness of each of the second semiconductor epitaxial layer sub-segments 4a sequentially decreases.

Each of the second semiconductor epitaxial layer sub-segments obtains the thickness of the corresponding second semiconductor epitaxial layer sub-segment 4a through an etching process after the second semiconductor epitaxial layer 4 is formed at one time. Alternatively, each of the second semiconductor epitaxial layer sub-segments 4a is formed through a plurality of times of epitaxy and etching process.

The length of each of the second semiconductor epitaxial layer sub-segments 4a is the same or different.

Figure 4A:
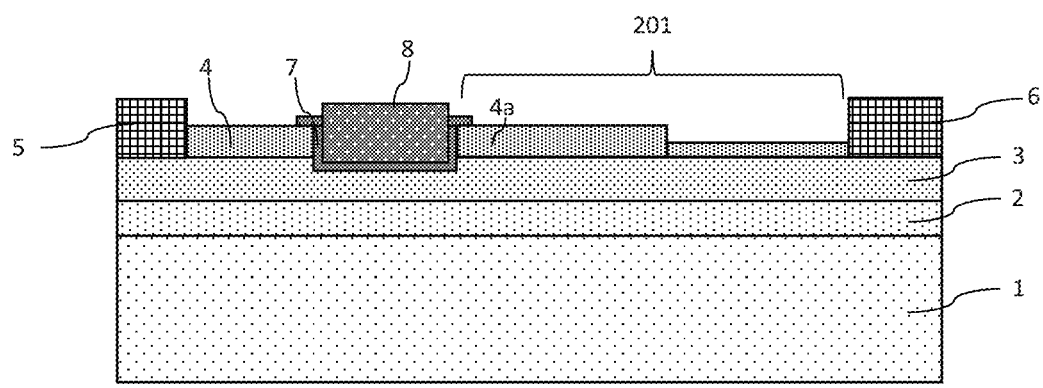
FIG. 4A illustrates a schematic diagram of a structure corresponding to FIG. 4 when the number of second semiconductor epitaxial sub-segments is two.

Referring to FIG. 4A, it illustrates a schematic diagram of a structure corresponding to FIG. 4 when the number of second semiconductor epitaxial sub-segments is two. It can be seen that it includes two second semiconductor epitaxial sub-segments 4a with thickness which sequentially decreases in the direction from the second side surface of the gate trench to the drain metal layer 6.

The number of the second semiconductor epitaxial layer sub-segments 4a may be extended from finite to infinite.

Embodiment 5 of the present application provides a planar high-electron-mobility transistor.

Figure 5:
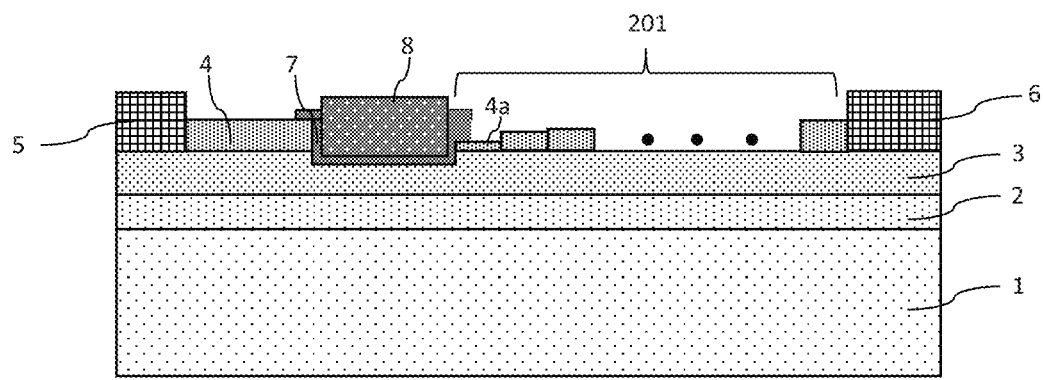
FIG. 5 illustrates a schematic diagram of a structure of a planar high-electron-mobility transistor according to embodiment 5 of the present application.

The planar high-electron-mobility transistor according to embodiment 5 of the present application has the following difference from the planar high-electron-mobility transistor according to embodiment 4 of the present application: the planar high-electron-mobility transistor according to embodiment 5 of the present application further includes the following features:

Referring to FIG. 5, it illustrates a schematic diagram of a structure of the planar high-electron-mobility transistor according to embodiment 5 of the present application. In the direction from the second side surface of the gate trench to the drain metal layer 6, the thickness of each of the second semiconductor epitaxial layer sub-segments 4*a* sequentially increases.

Figure 5A:
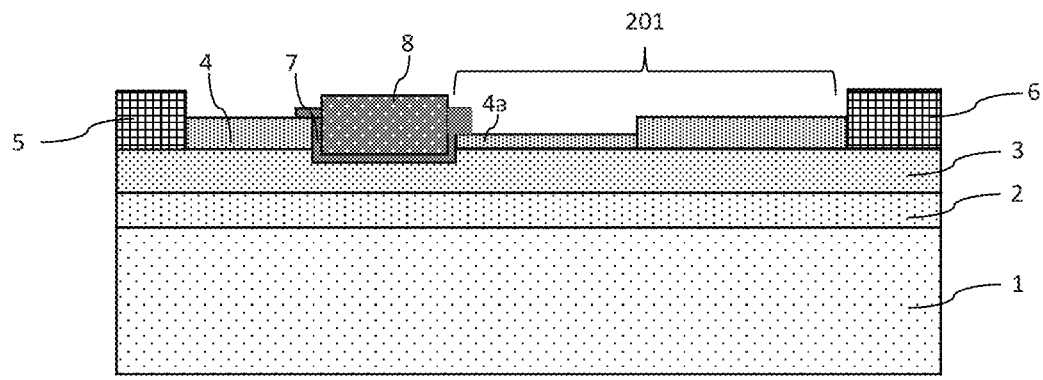
FIG. 5A illustrates a schematic diagram of a structure corresponding to FIG. 5 when the number of second semiconductor epitaxial sub-segments is two.

Referring to FIG. 5A, it illustrates a schematic diagram of a structure corresponding to FIG. 5 when the number of second semiconductor epitaxial sub-segments is two. It can be seen that it includes two second semiconductor epitaxial sub-segments 4*a* with thickness which sequentially increases in the direction from the second side surface of the gate trench to the drain metal layer 6.

Embodiment 6 of the present application provides a planar high-electron-mobility transistor.

Figure 6:
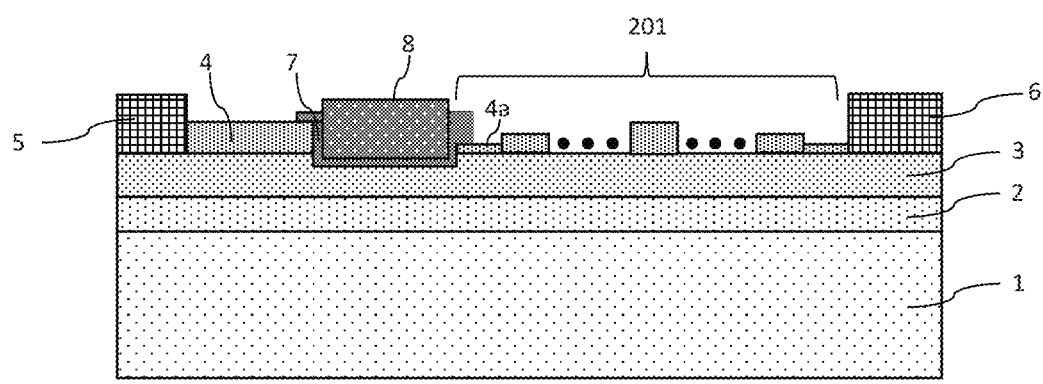
FIG. 6 illustrates a schematic diagram of a structure of a planar high-electron-mobility transistor according to embodiment 6 of the present application.

The planar high-electron-mobility transistor according to embodiment 6 of the present application has the following difference from the planar high-electron-mobility transistor according to embodiment 4 of the present application: the planar high-electron-mobility transistor according to embodiment 6 of the present application further includes the following features:

Referring to FIG. 6, it illustrates a schematic diagram of a structure of the planar high-electron-mobility transistor according to embodiment 6 of the present application. In the direction from the second side surface of the gate trench to the drain metal layer 6, the thickness of each of the second semiconductor epitaxial layer sub-segments 4*a* sequentially increases first and then sequentially decreases after increasing to a maximum value.

Embodiment 7 of the present application provides a planar high-electron-mobility transistor.

Figure 7:
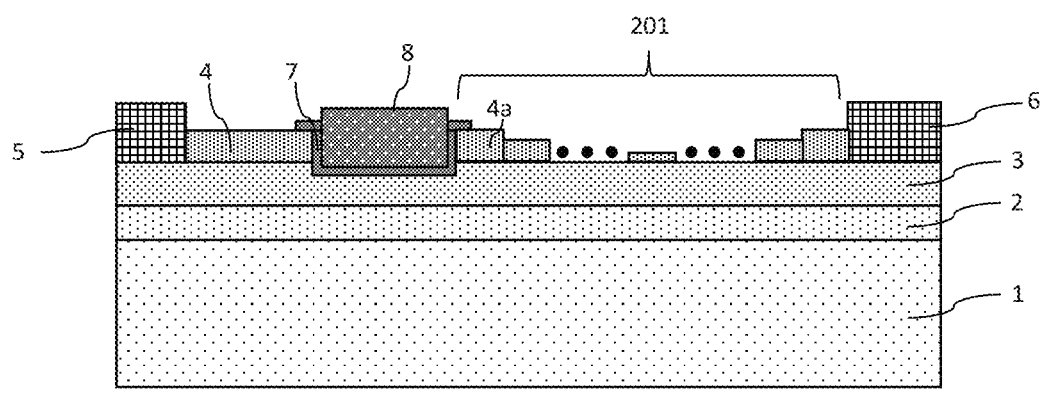
FIG. 7 illustrates a schematic diagram of a structure of a planar high-electron-mobility transistor according to embodiment 7 of the present application.

The planar high-electron-mobility transistor according to embodiment 7 of the present application has the following difference from the planar high-electron-mobility transistor according to embodiment 4 of the present application: the planar high-electron-mobility transistor according to embodiment 7 of the present application further includes the following features:

Referring to FIG. 7, it illustrates a schematic diagram of a structure of the planar high-electron-mobility transistor according to embodiment 7 of the present application. In the direction from the second side surface of the gate trench to the drain metal layer 6, the thickness of each of the second semiconductor epitaxial layer sub-segments 4*a* sequentially decreases first and then sequentially increases after decreasing to a minimum value.

Embodiment 8 of the present application provides a planar high-electron-mobility transistor.

Figure 8:
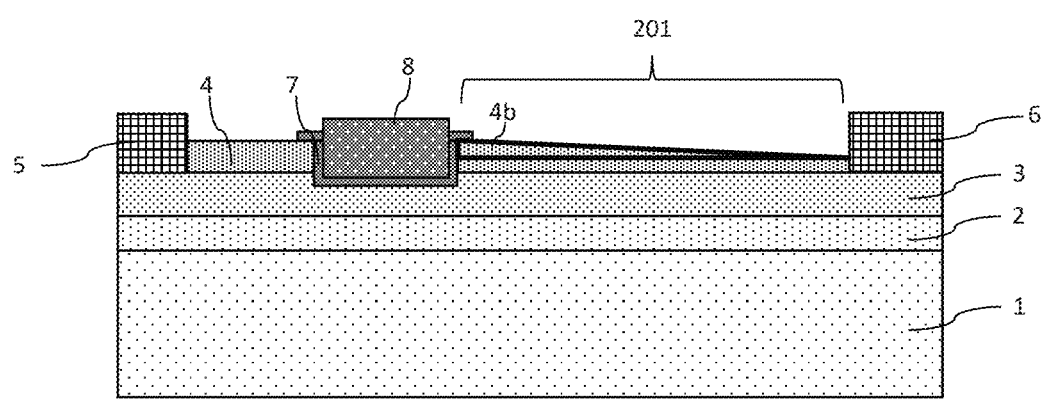
FIG. 8 illustrates a schematic diagram of a structure of a planar high-electron-mobility transistor according to embodiment 8 of the present application.

The planar high-electron-mobility transistor according to embodiment 8 of the present application has the following difference from the planar high-electron-mobility transistor according to embodiment 4 of the present application: the planar high-electron-mobility transistor according to embodiment 8 of the present application further includes the following features:

Referring to FIG. 8, it illustrates a schematic diagram of a structure of the planar high-electron-mobility transistor according to embodiment 8 of the present application. The charge balance structure includes:

a structure in which the thickness of the second semiconductor epitaxial layer 4 varies in a direction from the second side surface of the gate trench to the drain metal layer 6. The bound charge density at the interface of the first heterojunction is adjusted by adjusting the thickness of the second semiconductor epitaxial layer 4 so that the electric field distribution in the drift region is uniform. In FIG. 8, the second semiconductor epitaxial layer in region 201 is marked separately by reference sign 4*b*.

In embodiment 8 of the present application, in the direction from the second side surface of the gate trench to the drain metal layer 6, the thickness of the second semiconductor epitaxial layer 4*b* gradually decreases according to a linear function.

Embodiment 9 of the present application provides a planar high-electron-mobility transistor.

Figure 9:
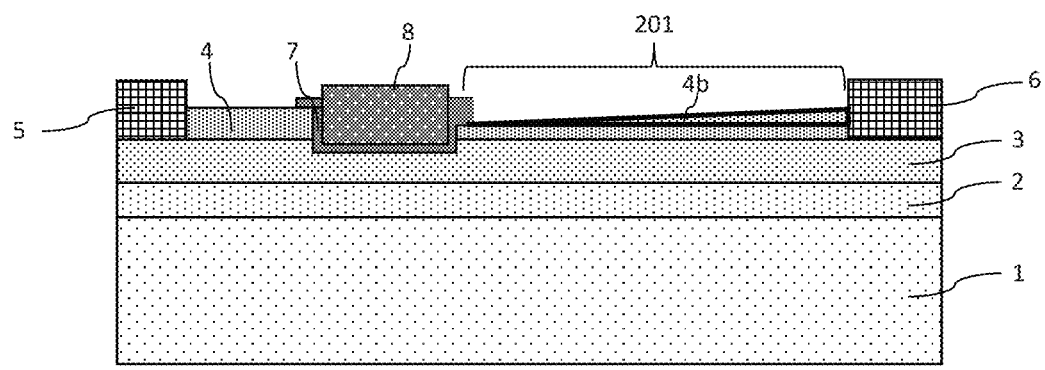
FIG. 9 illustrates a schematic diagram of a structure of a planar high-electron-mobility transistor according to embodiment 9 of the present application.

The planar high-electron-mobility transistor according to embodiment 9 of the present application has the following difference from the planar high-electron-mobility transistor according to embodiment 8 of the present application: the planar high-electron-mobility transistor according to embodiment 9 of the present application further includes the following features:

Referring to FIG. 9, it illustrates a schematic diagram of a structure of the planar high-electron-mobility transistor according to embodiment 9 of the present application. In the direction from the second side surface of the gate trench to the drain metal layer 6, the thickness of the second semiconductor epitaxial layer 4 gradually increases according to a linear function.

Embodiment 10 of the present application provides a planar high-electron-mobility transistor.

Figure 10:
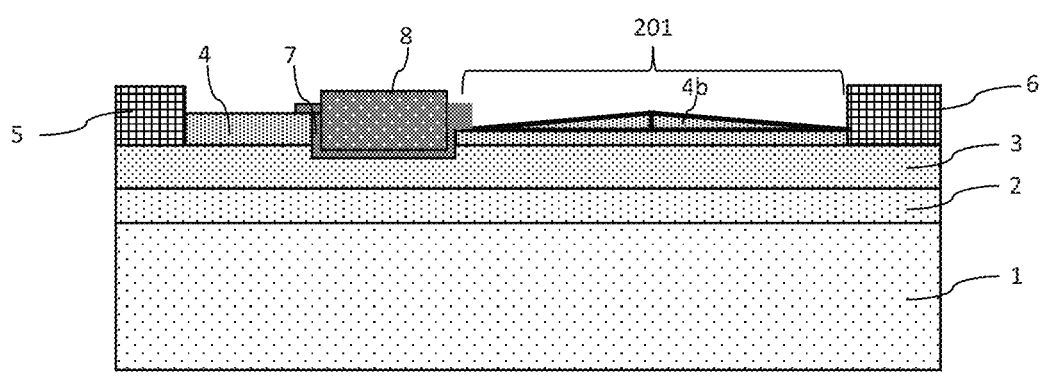
FIG. 10 illustrates a schematic diagram of a structure of a planar high-electron-mobility transistor according to embodiment 10 of the present application.

The planar high-electron-mobility transistor according to embodiment 10 of the present application has the following difference from the planar high-electron-mobility transistor according to embodiment 8 of the present application: the planar high-electron-mobility transistor according to embodiment 10 of the present application further includes the following features:

Referring to FIG. 10, it illustrates a schematic diagram of a structure of the planar high-electron-mobility transistor according to embodiment 10 of the present application. In the direction from the second side surface of the gate trench to the drain metal layer 6, the thickness of the second semiconductor epitaxial layer 4 gradually increases first according to a linear function and then gradually decreases according to a linear function after increasing to a maximum value.

Embodiment 11 of the present application provides a planar high-electron-mobility transistor.

Figure 11:
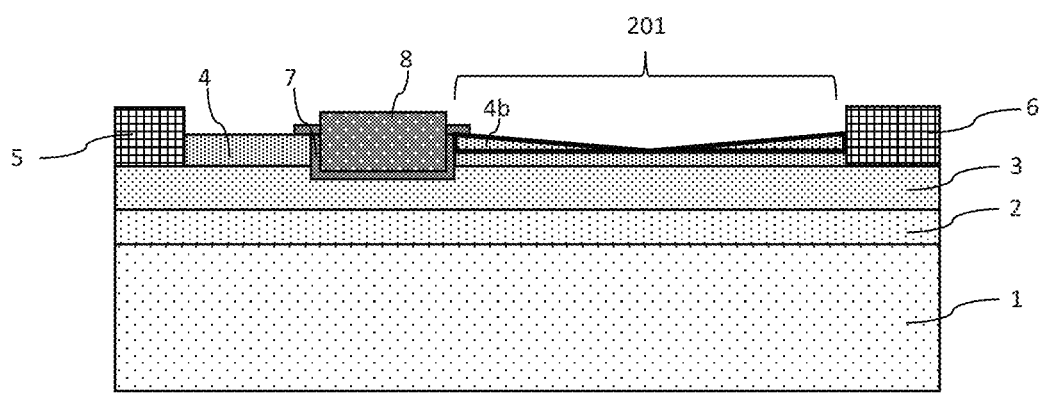
FIG. 11 illustrates a schematic diagram of a structure of a planar high-electron-mobility transistor according to embodiment 11 of the present application.

The planar high-electron-mobility transistor according to embodiment 11 of the present application has the following difference from the planar high-electron-mobility transistor according to embodiment 8 of the present application: the planar high-electron-mobility transistor according to embodiment 11 of the present application further includes the following features:

Referring to FIG. 11, it illustrates a schematic diagram of a structure of the planar high-electron-mobility transistor according to embodiment 11 of the present application. In the direction from the second side surface of the gate trench to the drain metal layer 6, the thickness of the second semiconductor epitaxial layer 4 gradually decreases first according to a linear function and then gradually increases according to a linear function after decreasing to a minimum value.

The device structures according to the embodiments of the present application have an important value in power semiconductor devices using gallium nitride as basic materials. However, the device structures according to the embodiments of the present application are not limited to gallium nitride materials, and are applicable to any material for manufacturing power semiconductor devices.

The embodiments of the present application are some innovative structures provided on the basis of typical gallium nitride high-electron-mobility transistors. The core of the embodiments of the present application includes using the concept of charge balance to design the drift region of the planar device. Through such structure, the electric field distribution can be optimized and made more uniform, thus achieving the purpose of optimizing the breakdown voltage and reliability of the device.

The device structures according to the embodiments of the present application are innovative structures based on gallium nitride high-electron-mobility transistors. This kind of device mainly relies on the hetero-structure of aluminum gallium nitrogen (AlGaN) and gallium nitride (GaN), and uses the two-dimensional electron gas (2DEG) at the device as the conductive channel. However, the structures of the devices provided by the embodiments of the present application are not limited to gallium nitride hetero-structures only, but can also be used for other hetero-structures.

Firstly, the devices according to the embodiments of the present application use the MOS structure as the channel to realize normally-off devices, which combine the traditional MOSFETs and HEMTs to give full play to the advantages of the two device structures.

Secondly, the embodiments of the present application apply the concept of charge balance to high-electron-mobility devices, a thin layer of GaN, i.e., the third semiconductor epitaxial layer 101 is additionally grown on the surface of the AlGaN epitaxial layer, and charges of opposite polarity can be introduced and play the effect of charge balance. This kind of structure can be extended. For example, the top GaN layer is locally removed, so as to change the local electric field distribution, thus making the device design have a higher degree of freedom and allowing many different structures to be added.

Thirdly, in addition to introducing the top GaN layer, locally etching the AlGaN layer, i.e., the second semiconductor epitaxial layer 4, can also achieve interface charge engineering. Since the thickness of AlGaN will change the density of charge at the interface, locally removing the AlGaN layer can change the distribution of charge density in the whole drift region. It can be extended as follows: for example, the drift region is divided into a finite number of small units, and the AlGaN layer of each small unit is treated specifically, so that the charge distribution of the whole drift region can be designed according to the design needs, thus further improving the electric field distribution. It can be further extended as follows: the drift region is divided into an infinite number of small units, the AlGaN thickness of each unit can achieve a gradually varying effect, and the charge distribution in the drift region can be continuously functionalized by using the concept of calculus, so that the electric field distribution is optimized.

The present application has been described above in detail through specific embodiments, which, however, do not constitute restrictions on the present application. Without departing from the principle of the present application, those skilled in the art may also make many variations and improvements, which should also be regarded as falling within the scope of protection of the present application.

What is claimed is:

1. A planar high-electron-mobility transistor, wherein a device unit comprises:

a first semiconductor epitaxial layer and a second semiconductor epitaxial layer formed on a surface of the first semiconductor epitaxial layer, the first semiconductor epitaxial layer and the second semiconductor epitaxial layer forming a first hetero-junction and forming two-dimensional electron gas at an interface of the first hetero-junction; and a trench gate comprising a gate trench, a gate dielectric layer formed on an inner side surface of the gate trench and a gate conductive material layer filled in the gate trench, wherein the gate trench passes through the second semiconductor epitaxial layer so that a bottom surface of the gate trench is located in the first semiconductor epitaxial layer at the bottom of the two-dimensional electron gas, and the trench gate cuts off the two-dimensional electron gas into source-end two-dimensional electron gas and drain-end two-dimensional electron gas;

a source metal layer has spacing from a first side surface of the gate trench, and the source metal layer passes through the second semiconductor epitaxial layer, a bottom area of the source metal layer forms an ohmic contact with the source-end two-dimensional electron gas;

a drain metal layer has spacing from a second side surface of the gate trench, and the drain metal layer passes through the second semiconductor epitaxial layer, a bottom area of the drain metal layer forms an ohmic contact with the drain-end two-dimensional electron gas;

when a gate-source voltage between the gate conductive material layer and the source metal layer is higher than or equal to a threshold voltage, an inversion layer is formed on a surface of the first semiconductor epitaxial layer covered by side surfaces and a bottom surface of the gate conductive material layer, the inversion layer enables the source-end two-dimensional electron gas and the drain-end two-dimensional electron gas to be conducted to jointly form a conductive channel that enables the source metal layer and the drain metal layer to be conducted and to enable the device unit to be on; and when the gate-source voltage between the gate conductive material layer and the source metal layer is lower than the threshold voltage, the source-end two-dimensional electron gas and the drain-end two-dimensional electron gas are cut off to enable the device unit to be off;

wherein a drift region is located between the drain metal layer and the second side surface of the gate trench, a charge balance structure is arranged in the drift region, and, during reverse bias, the charge balance structure enables an electric field distribution in the drift region to be uniform;

wherein the charge balance structure comprises:

a third semiconductor epitaxial layer arranged on a surface of the second semiconductor epitaxial layer in the drift region, wherein bound charges are formed at an interface of a second hetero-junction formed by the third semiconductor epitaxial layer and the second semiconductor epitaxial layer, and the electric field distribution in the drift region is adjusted and enabled to be uniform through the bound charges at the interface of the second hetero-junction;

wherein, on the surface of the second semiconductor epitaxial layer in the drift region, the third semiconductor epitaxial layer is divided into more than one third semiconductor epitaxial layer sub-segments and more than one third semiconductor epitaxial layer spacer regions, the third semiconductor epitaxial layer sub-segments and the third semiconductor epitaxial layer spacer regions are alternately arranged on the surface of the second semiconductor epitaxial layer in the drift region;

wherein a number of the third semiconductor epitaxial layer sub-segments is one and a number of the third semiconductor epitaxial layer spacer regions is one;

wherein, in a direction from the second side surface of the gate trench to the drain metal layer, the third semiconductor epitaxial layer sub-segment and the third semiconductor epitaxial layer spacer region are sequentially arranged; or, in the direction from the second side surface of the gate trench to the drain metal layer, the third semiconductor epitaxial layer spacer region and the third semiconductor epitaxial layer sub-segment are sequentially arranged;

or, wherein the charge balance structure comprises:

a structure in which a thickness of the second semiconductor epitaxial layer varies in a direction from the second side surface of the gate trench to the drain metal layer, wherein a bound charge density at the interface of the first hetero-junction is adjusted by adjusting the thickness of the second semiconductor epitaxial layer so that the electric field distribution in the drift region is uniform;

wherein, in the direction from the second side surface of the gate trench to the drain metal layer, the second semiconductor epitaxial layer is divided into more than two second semiconductor epitaxial layer sub-segments according to thickness;

or, in the direction from the second side surface of the gate trench to the drain metal layer, the thickness of the second semiconductor epitaxial layer gradually increases or decreases according to a linear function, or increases first according to a linear function and then decreases according to a linear function after increasing to a maximum value, or decreases first according to a linear function and then increases according to a linear function after decreasing to a minimum value.

2. The planar high-electron-mobility transistor according to claim 1, wherein the planar high-electron-mobility transistor is an enhanced device and the threshold voltage is more than 0V.

3. The planar high-electron-mobility transistor according to claim 2, wherein the first semiconductor epitaxial layer adopts a wide-bandgap semiconductor material and the second semiconductor epitaxial layer adopts a wide-bandgap semiconductor material.

4. The planar high-electron-mobility transistor according to claim 3, wherein a material of the first semiconductor epitaxial layer comprises gallium nitride and a material of the second semiconductor epitaxial layer comprises aluminum gallium nitride.

5. The planar high-electron-mobility transistor according to claim 4, wherein the first semiconductor epitaxial layer is formed on a buffer layer and the buffer layer is formed on a substrate.

6. The planar high-electron-mobility transistor according to claim 5, wherein a material of the substrate comprises silicon or sapphire.

7. The planar high-electron-mobility transistor according to claim 4,
wherein a material of the third semiconductor epitaxial layer comprises gallium nitride.

8. The planar high-electron-mobility transistor according to claim 7, wherein the third semiconductor epitaxial layer continuously covers the surface of the second semiconductor epitaxial layer in the drift region.

9. The planar high-electron-mobility transistor according to claim 7, wherein a thickness of the third semiconductor epitaxial layer is less than 5 nm.

10. The planar high-electron-mobility transistor according to claim 4, wherein a material of the gate dielectric layer comprises silicon oxide or aluminum oxide, and the gate conductive material layer comprises a polysilicon gate or a metal gate.

11. The planar high-electron-mobility transistor according to claim 4, wherein the first semiconductor epitaxial layer is of first conductive type doping or second conductive type doping, or is undoped.

12. The planar high-electron-mobility transistor according to claim 1, wherein the number of the third semiconductor epitaxial layer sub-segments is more than one and the number of the third semiconductor epitaxial layer spacer regions is one less than the number of the third semiconductor epitaxial layer sub-segments, and in a direction from the second side surface of the gate trench to the drain metal layer, the third semiconductor epitaxial layer sub-segments and the third semiconductor epitaxial layer spacer regions are sequentially arranged.

13. The planar high-electron-mobility transistor according to claim 1, wherein, after the third semiconductor epitaxial layer is formed through epitaxial growth of the third semiconductor epitaxial layer sub-segment, selective etching is performed to the third semiconductor epitaxial layer.

14. The planar high-electron-mobility transistor according to claim 1, wherein, in the direction from the second side surface of the gate trench to the drain metal layer, the thickness of each of the second semiconductor epitaxial layer sub-segments sequentially increases or decreases, or sequentially increases first and then sequentially decreases after increasing to a maximum value, or sequentially decreases first and then sequentially increases after decreasing to a minimum value.

15. The planar high-electron-mobility transistor according to claim 1, wherein each of the second semiconductor epitaxial layer sub-segments obtains a thickness of a corresponding second semiconductor epitaxial layer sub-segment through an etching process after the second semiconductor epitaxial layer is formed at one time;

or, each of the second semiconductor epitaxial layer sub-segments is formed through a plurality of times of epitaxy and etching process.

16. The planar high-electron-mobility transistor according to claim 1, wherein the length of each of the second semiconductor epitaxial layer sub-segments is the same or different.

* * * * *